(12) United States Patent
Matsui

(10) Patent No.: US 6,281,739 B1
(45) Date of Patent: Aug. 28, 2001

(54) FUSE CIRCUIT AND REDUNDANT DECODER

(75) Inventor: Yoshinori Matsui, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/347,418

(22) Filed: Jul. 6, 1999

(30) Foreign Application Priority Data

Jul. 6, 1998 (JP) .................................. 10-190507

(51) Int. Cl.$^7$ ........................... H01H 37/76; H01H 85/00
(52) U.S. Cl. ............................................................ 327/525
(58) Field of Search .................................. 327/525, 526, 327/215, 219; 365/225.7, 96

(56) References Cited

U.S. PATENT DOCUMENTS

| | | | |
|---|---|---|---|
| 5,345,110 | * 9/1994 | Renfro et al. | 327/525 |
| 5,402,390 | * 3/1995 | Ho et al. | 365/225 |
| 5,566,107 | * 10/1996 | Gilliam | 365/200 |
| 5,600,277 | * 2/1997 | Koelling | 327/526 |
| 5,818,285 | * 10/1998 | Lee et al. | 327/525 |
| 5,838,624 | * 11/1998 | Pilling et al. | 365/225.7 |
| 5,929,691 | * 7/1999 | Kim et al. | 327/525 |
| 6,037,831 | * 3/2000 | Watrobski et al. | 327/525 |

FOREIGN PATENT DOCUMENTS

| | | |
|---|---|---|
| 11-65098 | 6/1989 | (JP) . |
| 41-47494 | 5/1992 | (JP) . |
| 52-50892 | 9/1993 | (JP) . |
| 8-96594 | 4/1996 | (JP) . |
| 83-21197 | 8/1996 | (JP) . |

* cited by examiner

Primary Examiner—My-Trang Nu Ton
(74) Attorney, Agent, or Firm—Young & Thompson

(57) ABSTRACT

The programming fuse circuit is comprised of a fuse for programming 103, which is connected between the first voltage supplying circuit 101 and the second voltage supplying circuit 102, and also which is cut off as necessary, and a hold/driver circuit 106, which is connected to a contact 100. Wherein, the first voltage supplying circuit 101 provides a first voltage for the contact 100 in conformity with the first initializing signal, which is generated during the time for setting the device operating mode. The second voltage supplying circuit 102 provides a second voltage for the contact 100 in conformity with the second initializing signal 105, which is generated also during the time for setting the device operating mode. The hold/driver circuit 106 holds either the first voltage supplied or the second voltage supplied, and outputs it.

11 Claims, 14 Drawing Sheets

PRIOR ART  Fig.18
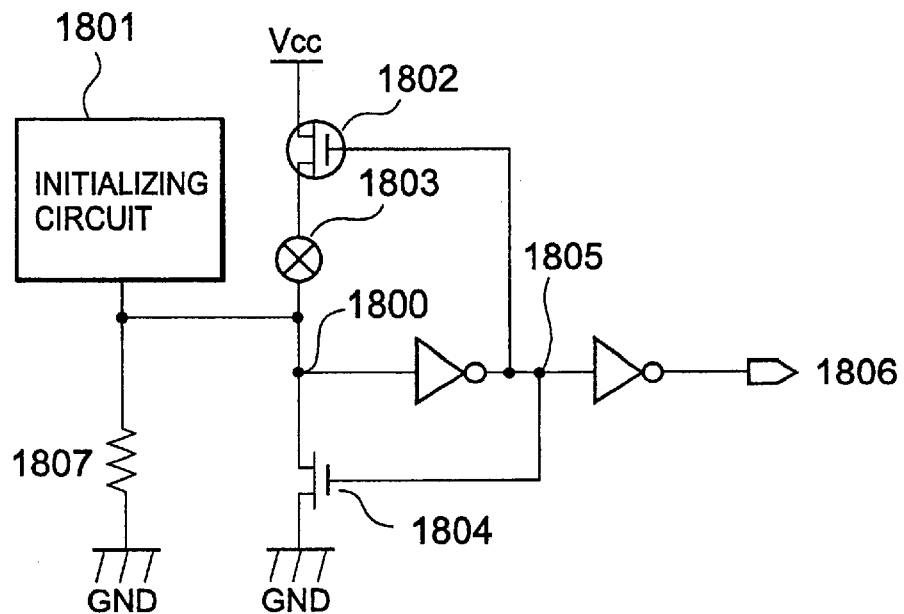
PRIOR ART  Fig.19
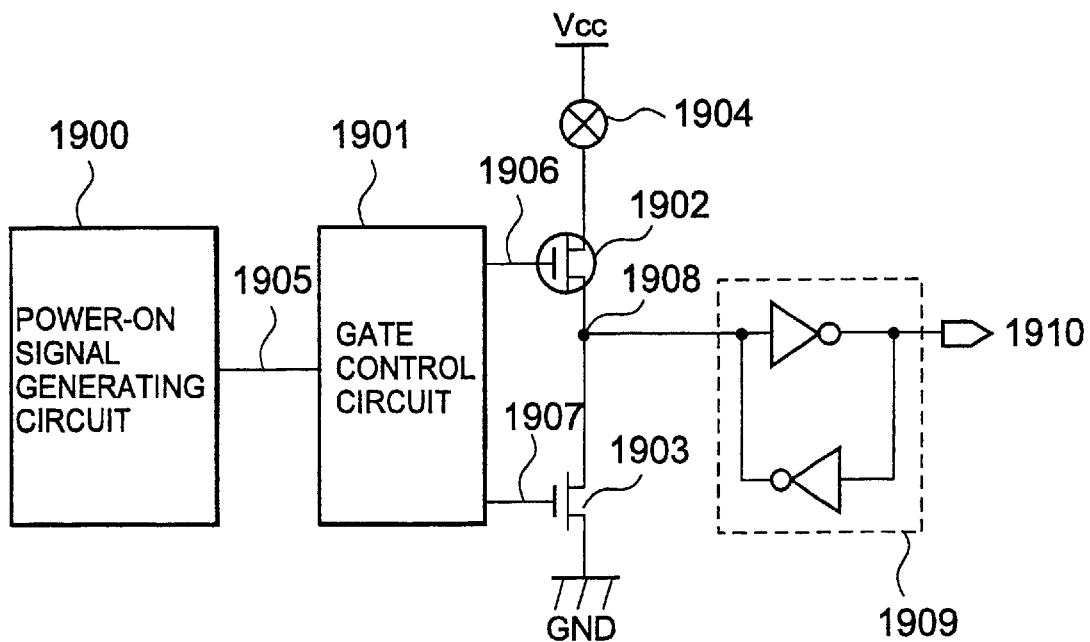

PRIOR ART Fig.20
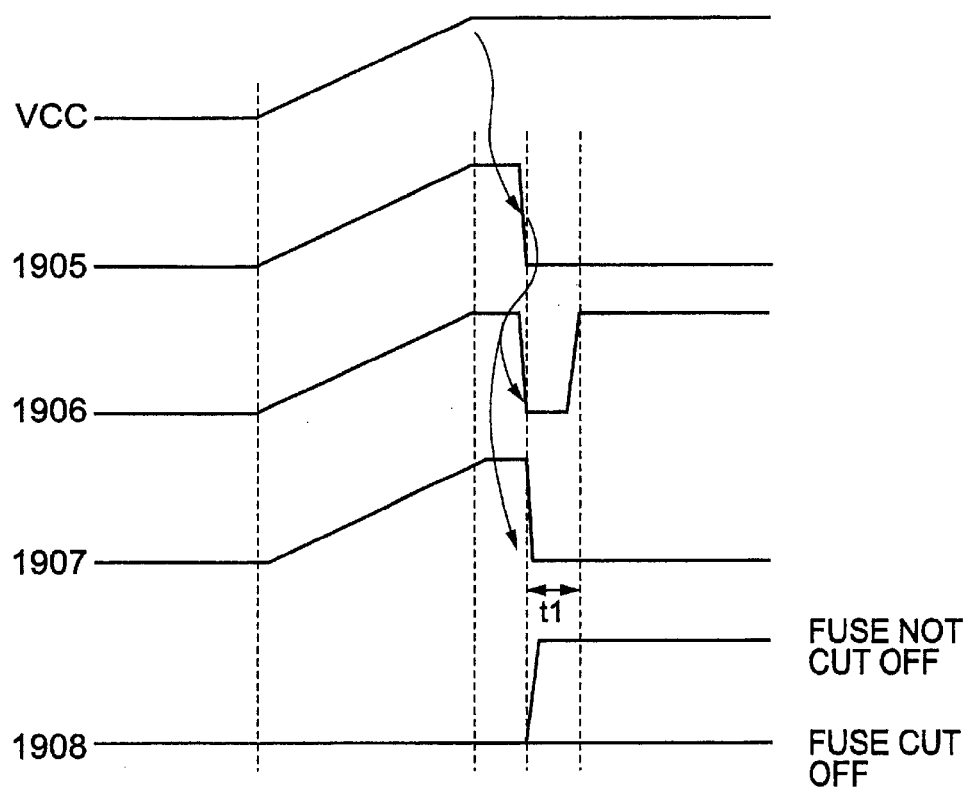
PRIOR ART Fig.21
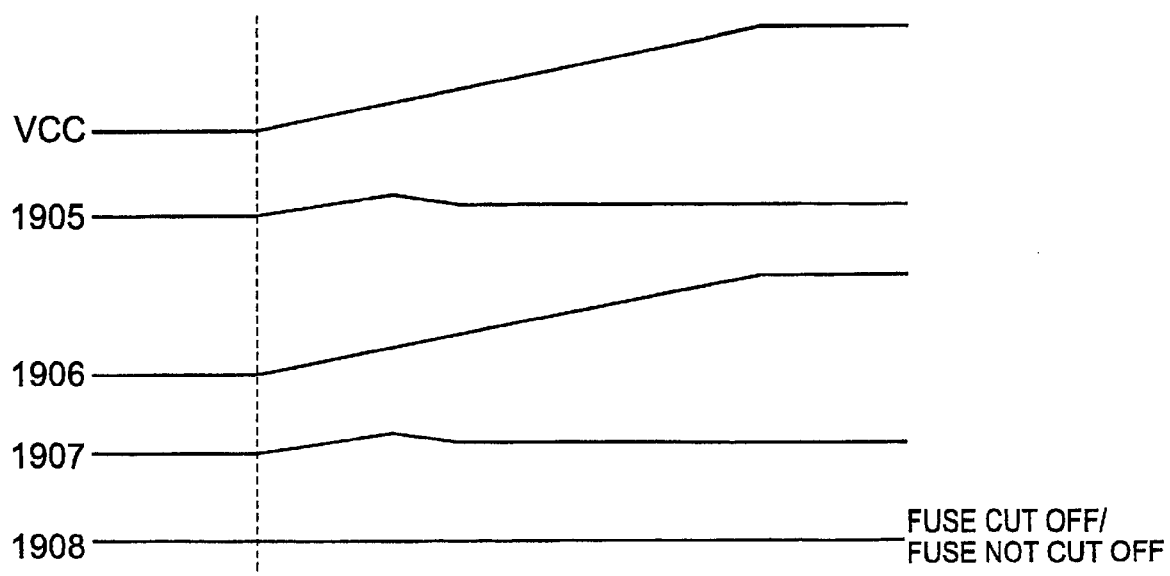

FUSE CIRCUIT AND REDUNDANT DECODER

BACKGROUND OF THE INVENTION

1. Field of the Invention

The present invention relates to a fuse circuit and redundant decoder, in particular, ones that are used for a memory device.

2. Description of the Related Art

Greatly due to the progress of microscopic process technology, the capacity of a semiconductor memory device, which is mostly represented by DRAM (Dynamic Random Access Memory), has rapidly been increasing year by year. The wiring, transistor, capacitor, etc. that composite the semiconductor memory device has been annually decreasing in size.

As a result, it is very difficult to make all semiconductor memory devices free of faulty memory elements. If a single abnormal memory element exists, the semiconductor memory device is defective, and measures must be taken to keep the yield from dropping. In order to solve this problem, a redundant circuit is generally established within the memory device.

When there is a defective memory element (a defective memory cell) in the memory device, the redundant circuit acts as a circuit which replaces it with a spare memory element (a redundant cell). As the corresponding address is entered, the defective memory element is detected and access to the element is prevented. In turn, the redundant cell is accessed, making it seem from the outside as if the defect never existed. By using the redundant circuit in this way, the semiconductor memory device, which includes some defective cells caused by product imperfections, is marketable. Therefore, the yield of the merchandise makes great strides.

As described above, the redundant circuit replaces a defective memory cell with a redundant cell. Accordingly, the redundant circuit must have the capacity to continuously monitor each of the addresses supplied from outside the semiconductor memory device, and detect the address corresponding to the defective memory cell. An example of a circuit with the above detection capacity is generally attained using a fuse-based, programmable circuit.

Japanese Patent Application Laid-open No. Hei-8-96594 discloses such a programmable circuit. In this application, the programmable circuit has two fuses for each of the bits that make up the address signal. The programmable circuit is programmed to operate in a certain circuit pattern, by cutting off either one of the two fuses. Thus, each fuse can be set up to be either conductive or not, according to the configuration of each of the bits making up the address signal. For example, when one of the bits is high level, its corresponding fuse is set to be non-conductive, whereas when it is low level, its corresponding fuse is set to be conductive. With this fuse-based configuration, an address signal, which makes all the fuses corresponding to the respective bits non-conductive, can be detected. Therefore, programming a specific address as a defective address allows its corresponding address signal to be always monitored and detected.

The system disclosed in Japanese Patent Application Laid-open No. Hei-8-96594, however, has a problem where two fuses for each of the bits making up an address signal are necessary. For example, where the address signal is made up of ten bits, twenty fuses are needed for programming a single defective address and, 2,048 fuses are needed in the semiconductor memory device with a capacity of programming 1,024 defective addresses. In this case, since each fuse has to occupy a large area on the chip, forming such a quantity of fuses in the chip requires a large chip. This is not preferable.

Accordingly, another programmable system, where only a single fuse for each of the bits making up the address signal is used, has been proposed so as to solve the above problem. In this system, each bit of a defective address is memorized as either "1" or "0" by either cutting off or not the corresponding single fuse. The initializing step, right after energizing, stores the above defective address memorized, in a volatile, holding circuit. According to this system, the number of necessary fuses are practically halved, compared to the aforementioned system, due to the fact that only a single fuse for each of the bits that make up the defective address is necessary.

However, the above system requires an additional operation such as the initializing operation, which is performed right after energizing, even though the number of fuses can be largely reduced. More specifically, the initializing operation is performed in such a manner that electric current paths are generated for the respective fuses in response to an initial signal (a reset signal), which has entered the chip. Thereafter, whether or not an electric current can flow through each fuse is detected so as to store resulting data in a volatile, holding circuit such as a flip-flop circuit. Japanese Patent Application Laid-open No. Hei-5-101673 discloses such a circuit as shown in FIG. 18, as an example.

In FIG. 18, an initializing circuit 1801 outputs a high level signal at a fixed time period during the initializing operation. (The initializing circuit 1801 outputs a low level signal for the other time period)

In the case where the fuse 1803 is cut off, the initializing circuit 1801 provides a high level signal for a contact 1800 within the device initializing time. Accordingly, a contact 1805 becomes a low level, thus turning on the p-channel MOS transistor 1802. However, since the fuse 1803 is cut off, the level of the contact 1800 becomes low when the signal from the initializing circuit 1801 returns to the low level.

At this point, the contact 1805 becomes high level, thus turning off the p-channel MOS transistor 1802. An output signal 1806 becomes low at the same time.

According to this circuit, even if the fuse 1803 has been insufficiently cut off using a laser, a possible electric current path through the p-channel MOS transistor 1802 is not generated due to the fact that the transistor 1802 is off.

However, in the case where the voltage of the contact 1800 is high level, with the fuse 1803 not cut off, the circuit in FIG. 18 has a problem in that an unnecessary electric current (a leakage current) must flow through the electric current path via the high-impedance resistor 1807 and the p-channel MOS transistor 1802. This state results from the fact that the transistor 1802 is on.

Japanese Patent Application Laid-open No. Hei-8-321197 discloses a fuse circuit as illustrated in FIG. 19, which completely prevents a leakage current from flowing even if the fuse is incompletely cut off.

The circuit in FIG. 19 prevents a leakage current from flowing, which results from the fuse being incompletely cut off, by detecting the event of energizing, and also whether or not a fuse is completely cut off after the energizing has been stably made at a predetermined timing. Immediately after a power-on signal generating circuit 1900 in FIG. 19 is stably energized and outputs a power-on signal 1905, the other circuits detect the state of the fuse 1904.

FIG. 20 illustrates the waveforms of respective signals in the circuit in FIG. 19 when the circuit is energized. The power-on signal 1905 keeps on increasing in its voltage parallel to the increase in magnitude of the supply voltage VCC, until the magnitude reaches a predetermined level. When the magnitude reaches this level, the power-on signal 1905 becomes the grounded level. Upon reception of the power-on signal 1905, a gate control circuit 1901 outputs both a pre-charging signal 1906 and a discharging signal 1907.

The pre-charging signal 1906 increases in its voltage parallel to the increase in the voltage of the power-on signal 1905. Next, it goes down sharply to and stays at the grounded level within a predetermined time period, t1, also parallel to the decrease in the voltage of the power-on signal 1905. In the same manner, the discharging signal 1907 increases in its voltage parallel to the increase in the voltage of power-on signal 1905. Next, it sharply goes down to and stays at the grounded level, also parallel to the decrease in the voltage of the power-on signal 1905. The n-channel MOS transistor 1903 is on whereas the p-channel MOS transistor 1902 is off, as during energizing, in accordance with the voltage levels of the signals 1907 and 2006. This allows the voltage at the contact 1908 to stay on the grounded level. Thereafter, in sync with the transition of the signal 1905 down to th e grounded level, the n-channel MOS transistor 1903 turns off, whereas the p-channel MOS transistor 1902 turns on and stays on within the time period, t1. At this time, if the fuse 1904 is not cut of f, the signal 1908 goes up to the VCC level. On the other hand, if the fuse is cut off, the signal 1908 stays in the grounded voltage level due to the fact that the supply voltage VCC is not supplied. A latch circuit 1909 holds the voltage level at the contact 1908. The pre-charge signal 1906 goes up to the supply voltage VCC immediately after the predetermined time period, t1, causing the p-channel MOS transistor 1902 to turn off and stays off in the subsequent, steady state. Therefore, an unnecessary electric current (a leakage current) does not flow, even if the fuse 1904 is incompletely cut off, due to the fact that a possible leakage current-flow pa this not generated.

FIG. 21 illustrates the signal waveforms generated in the circuit in FIG. 19, where the supply voltage VCC goes up very slowly. In the normal states, the supply voltage VCC is supplied to the power-on signal generating circuit 1900 in FIG. 19, which then detects whether or not the steady state is reached. However, as shown in FIG. 21, in the case where the supply voltage VCC, which is supplied to the power-on signal generating circuit 1900, goes up very slowly, the power-on signal generating circuit 1900 may wrongly determine that the energizing has entered a steady state. This leads to the output of an incompletely rising signal to a gate control circuit 1901, and causes the abnormal outputs of the pre-charging signal 1906 and the discharging signal 1907, to be generated by the gate control circuit 1901. Accordingly, the contact 1908 is not normally initialized either. In addition, the voltage at the contact 1908 does not reach the supply voltage level VCC if the fuse 1904 is not cut off.

In other words, there is a problem with the circuit in FIG. 19, where the power-on signal generating circuit 1900 does not have enough resolution to detect the steady state of the supply voltage. Therefore, the gate control circuit 1901 cannot output the normal signals 1906 and 1907 with normal level transition, as shown in FIG. 21. This causes a problem where the circuit relevant to the fuse 1904 cannot be normally initialized.

In summary, as is described above, according to the circuit in FIG. 18, in the case where the voltage of the contact 1800 is kept to be the high level, with the fuse 1803 not cut off, an unnecessary electric current (a leakage current) must flow through the electric current path via a high-impedance resistor 1807 and the p-channel MOS transistor 1802.

Furthermore, as is also described above, according to the circuit in FIG. 19, there is a problem where the power-on signal generating circuit 1900 does not have enough resolution to detect the steady state of the supply voltage. Therefore the gate control circuit 1901 cannot output the normal signals 1906 and 1907 with normal level transition. This also causes a problem where the circuit relevant to the fuse cannot be normally initialized.

SUMMARY OF THE INVENTION

Accordingly, an objective of the present invention is to provide a fuse circuit, which is surely initialized without an unnecessary electric current flow.

To attain the above objective, according to an aspect of the present invention, a fuse circuit is provided, comprising the following: a first voltage supplying circuit, which receives the first initializing signal generated during the time for setting a device operating mode; a second voltage supplying circuit, which receives the second initializing signal generated during the time for setting a device operating mode; a fuse, which is made of a material such as a polycrystalline silicon layer, and which is cut off as necessary for programming, and which is connected between the first voltage supplying circuit and the second voltage supplying circuit; and a hold/driver circuit, which is connected to the contact of the first voltage supplying circuit and the fuse. Wherein, the first voltage supplying circuit provides a first voltage for the contact in conformity with the first initializing signal. The second voltage supplying circuit provides a second voltage for the contact in conformity with the second initializing signal. The hold/driver circuit holds either the first voltage supplied or the second voltage supplied, and outputs it. The voltage at the contact can be fixed or programmed to be either the first voltage or the second voltage by cutting off the fuse or not. It is preferable that the first and the second voltage supplying circuit are both made up of a plurality of MOS transistors. The hold/driver circuit is comprised of several inverters, and the composite of a pair of inverters is a flip-flop circuit. The flip-flop circuit holds the voltage fixed at the contact.

According to an aspect of the present invention, the above fuse circuit receives only an active, first initializing signal, thus allowing an operating test to be done in the state where the fuse is cut off. Furthermore, by adding the third voltage supplying circuit to the aforementioned contact, the contact can be initialized to become a third voltage in conformity with the third initializing signal.

According to an aspect of the present invention, a redundant decoder is provided programming a replacing address and determining whether to use or not a redundant circuit, by using either one of the above fuse circuits. Furthermore, multiple, redundant decoders are provided programming a plurality of independent, replacing addresses, by selectively cutting off the fuses.

BRIEF DESCRIPTION OF DRAWINGS

The above and other objects, features and advantages of the present invention will become apparent from the following detailed description in the embodiment section, when taken in conjunction with the accompanying drawings, wherein:

FIG. 18 illustrates the configuration of an example of the conventional fuse circuit;

FIG. 19 illustrates the configuration of another example of the conventional fuse circuit;

FIG. 20 illustrates the waveforms of the signals generated in the circuit in FIG. 19 when energizing the circuit; and FIG. 21 illustrates the waveforms of the signals generated in the circuit in FIG. 19 when a supply voltage goes up very slowly.

DETAILED DESCRIPTION OF THE PREFERRED EMBODIMENTS

Hereafter, an embodiment, according to the present invention, will be explained with reference to drawings.

Figure 1:
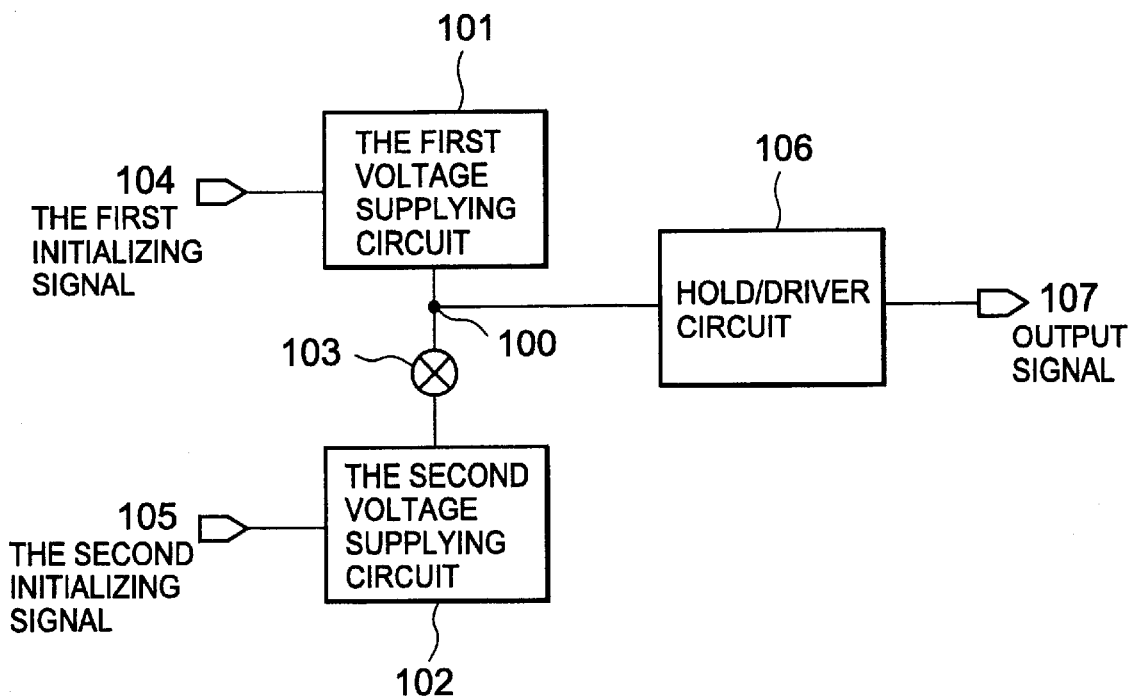
FIG. 1 illustrates the configuration of a fuse circuit, according to an embodiment of the present invention.

FIG. 1 illustrates the configuration of a fuse circuit, according to the embodiment of the present invention. The fuse circuit is made up of a first voltage supplying circuit 101, a second voltage supplying circuit 102, a fuse 103, and a hold/driver circuit 106. The first voltage supplying circuit 101 inputs the first initializing signal 104 generated at the same time when the operating mode of a device such as a memory device, which includes the fuse circuit, is set. The second voltage supplying circuit 102 inputs the second initializing signal 105 generated at also the same time the device operating mode is set. The fuse 103 is connected between the first voltage supplying circuit and the second voltage circuit. The hold/driver circuit 106 is connected to the contact between the first voltage supplying circuit 101 and the fuse 103.

Upon reception of the first initializing signal 104, the first voltage supplying circuit 101 provides the contact 100 with the firs t voltage. Upon reception of the second initializing signal 105, the second voltage supplying circuit 102 provides the contact 100 with the second voltage. The hold/driver circuit 106 is made up of a hold circuit, which holds a determined voltage at the contact 100, and a driver which drives an output signal 107 or the one held by the hold circuit.

Figure 2:
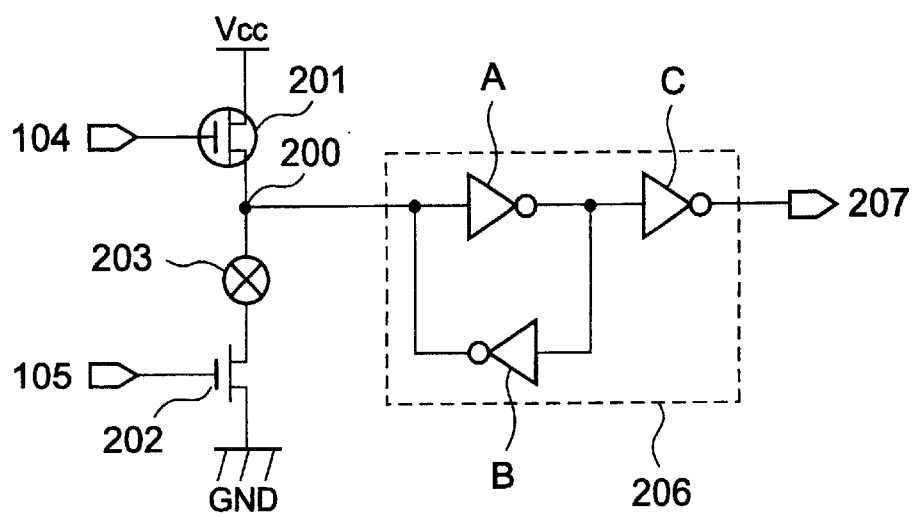
FIG. 2 illustrates the configuration of a fuse circuit, which is made up of MOS transistors, according to an embodiment of the present invention.

FIG. 2 illustrates the configuration of the fuse circuit, according to the embodiment of the present invention, which is made up of MOS transistors.

The source electrode of a p-channel MOS transistor 201, which makes up the first voltage supplying circuit, is connected to a power supply Vcc or a high voltage supply. The drain electrode is connected to one of the terminals of the fuse 203, which is made from a layer of polycrystal silicon. Moreover, the first initializing signal 104 enters the gate electrode of the p-channel MOS transistor 201.

The source electrode of a p-channel MOS transistor 202, which makes up the second voltage supplying circuit, is connected to a power supply GND which is grounded, whereas the drain electrode is connected to the other terminal of the fuse 203. Moreover, the second initializing signal 105 enters the gate electrode of the p-channel MOS transistor 202.

The hold/driver circuit 206, which is connected to both the drain electrode of th e p-channel MOS transistor 201 and one of t he terminals of the fuse 203, via the contact 200, is made up of three inverters: A, B, and C.

With the configuration of the fuse circuit as shown in FIG. 2, upon reception of the first initializing signal 104, the p-channel MOS transistor 201 provides the contact 200 with the first voltage or a high supply voltage VCC. Upon reception of the second initializing signal 105, the p-channel MOS transistor 202 provides the contact 200 with the second voltage or a low supply voltage (grounding voltage GND).

When the voltage at the contact 200 reaches either the first voltage or the second voltage, both transistors 201 and 202 turn off. The voltage reached is held by a flip-flop, made up of two inverters A and B in the hold/driver circuit 206. The inverter C in the hold/driver circuit 206 then drives the resulting output signal 207.

Since both transistors 201 and 202 turn off at the point when the voltage of the contact 200 has reached either the first voltage or the second voltage, an unnecessary, electric current path is not generated, thus preventing an occurrence of a unnecessary current flow (a leakage current flow).

Next, the operation of the fuse circuit, according to the embodiment of the present invention, will be described with reference to FIGS. 2, 3, and 4.

The fuse circuit of the embodiment internally generates a fuse circuit initializing signal, upon reception of an initializing signal, thereby fixing an internally programmed value of the fuse circuit itself.

Figure 3:
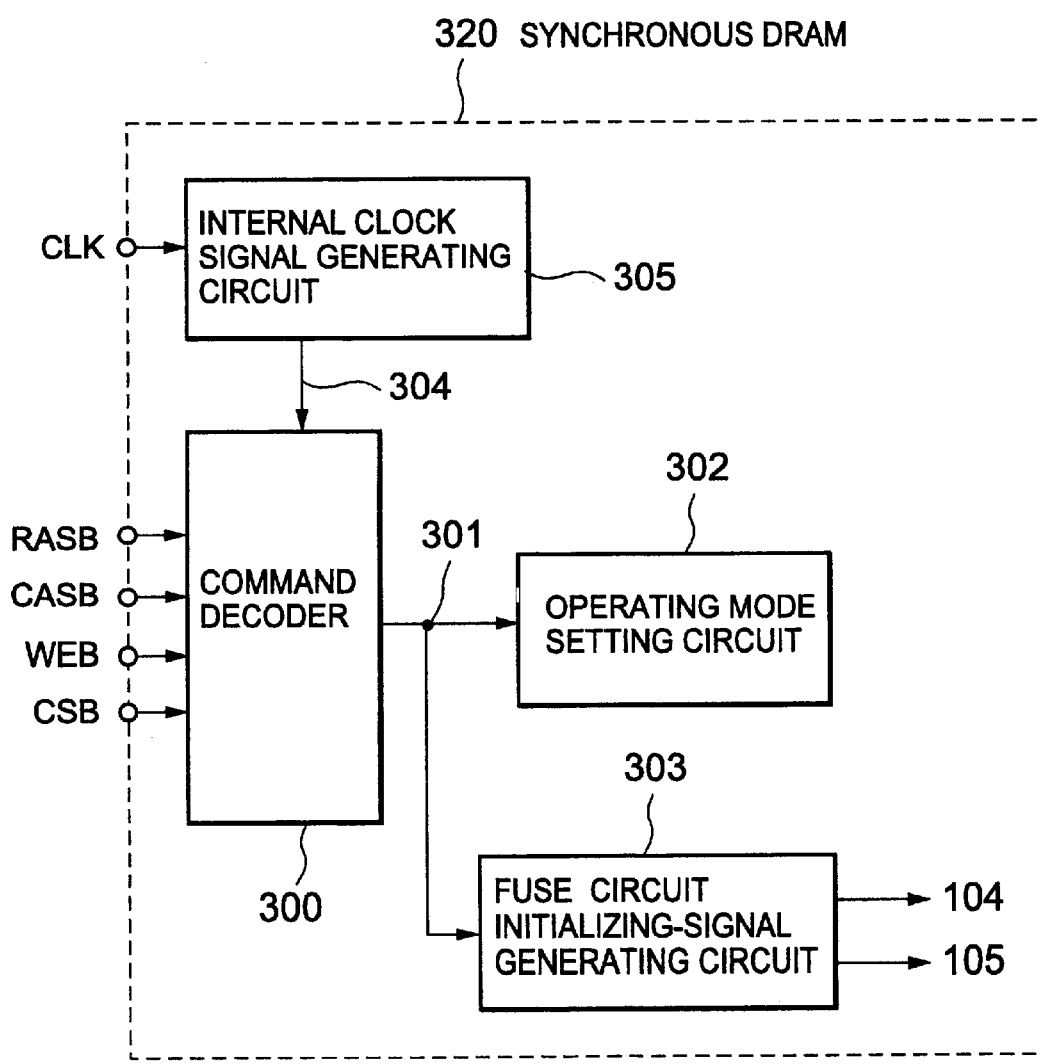
FIG. 3 illustrates the configuration of a synchronous DRAM, according to an embodiment of the present invention.

FIG. 3 illustrates the configuration of an operating mode setting circuit in the synchronous DRAM. The synchronous DRAM takes in the levels of command signals RASB, CASB, WEB, and CSB in sync with the rising edge of a system clock signal CLK, which is provided from outside, identifying a command represented by the combination of these levels. The synchronous DRAM then operates in conformity with the command identified.

The synchronous DRAM 320 in FIG. 3, is comprised of an internal clock signal generating circuit 305, a command decoder 300, an operating mode setting circuit 302, and a fuse circuit initializing-signal generating circuit 303. Where in, the internal clock signal generating circuit 305 generates a clock signal 304 dependent upon the system clock CLK. The command decoder 300 decodes an input command, and generates an operating mode setting signal 301. Both the operating mode setting circuit 302 and the fuse circuit initializing-signal generating circuit 303 receive the operating mode setting signal 301. The fuse circuit initializing-signal generating circuit 303 outputs the first initializing signal 104 and the second initializing signal 105, to the first voltage supplying circuit (101 in FIG. 1; 210 in FIG. 2) and the second voltage supplying circuit (102 in FIG. 1; 202 in FIG. 2), respectively. It is noted that the description and illustration of necessary, operating circuits (including the relevant signals) for the other possible commands are omitted.

Figure 4:
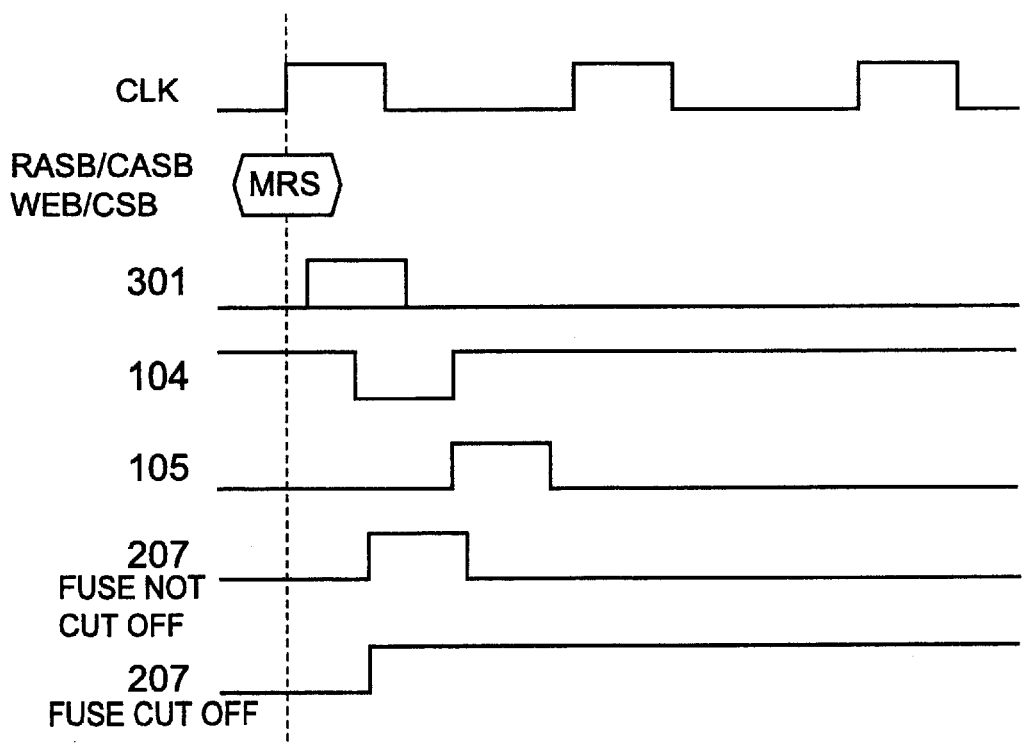
FIG. 4 is a timing-chart showing the operation of both the fuse circuit in FIG. 2 and the synchronous DRAM in FIG. 3, according to an embodiment of the present invention.

FIG. 4 is a timing-chart showing the operation of the above circuits in FIG. 3. Since data of the operating mode is set in a mode register, we call the operation of setting the operating mode as MRS or mode register setting. In FIG. 4, the MRS is written accordingly, showing that the mode register is to be set.

Upon reception of the operating mode setting signal 301, the fuse circuit initializing-signal generating circuit 303 generates and outputs the first initializing signal 104 (a low voltage level). The p-channel MOS transistor 201 (see FIG. 2) accordingly turns on upon reception of the first initializing signal 104 (the low voltage level), driving the contact 200 to become a high voltage level.

When the first initializing signal 104 returns to the high level, a high voltage level of the second initializing signal 105 is generated and output. The n-channel MOS transistor 202 turns on upon reception of the high voltage level of the second initializing signal 105.

Where the fuse 203 made of polycrystal silicon is cut of by a laser beam, the voltage level at the contact 200 is kept high.

On the other hand, where the laser beam does not cut off the fuse 103, the level at the contact 200 is kept low.

Thereafter, the second initializing signal 105 returns to the low level, thus turning off the n-channel MOS transistor 202. The first initialing signal 104 is kept high, thus keeping the p-channel MOS transistor 201 off.

In such a manner as described above, a programmed value, which is determined by either cutting off the fuse using a laser beam or not, is held by the latch circuit 206, and is output as a signal 107.

Figure 5:
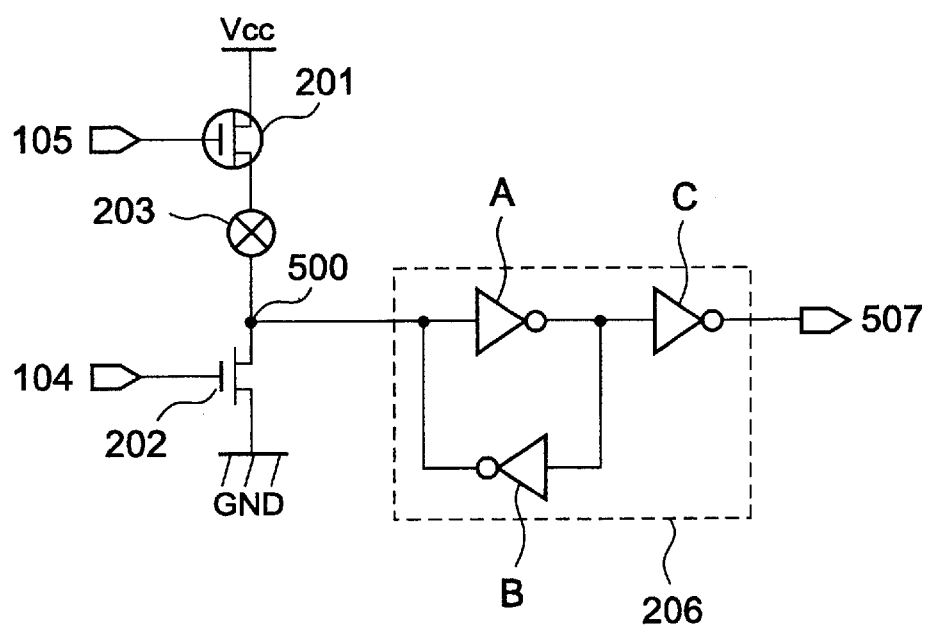
FIG. 5 illustrates the configuration of a fuse circuit, which is made up of MOS transistors, according to an embodiment of the present invention.

FIG. 5 illustrates the configuration of a fuse circuit, which gives the opposite polarity of a programming value to that in FIG. 2. It is noted that the identical elements in FIG. 5 to those in FIG. 2 are attached with the same reference numerals as those in FIG. 2. Accordingly, the description of the same elements will be omitted.

In FIG. 5, the first initializing signal 104 becomes active when it is high, whereas the second initializing signal 105 becomes active when it is low. Where the fuse 203 is cut off, the voltage level at the contact 500 is fixed to be low. On the other hand, where the fuse 203 is not cut off, the voltage level at the contact 500 is fixed to be high. Accordingly the output signal 507 is the high level.

Next, a column redundant circuit, which uses the fuse circuit, according to the present invention, will be described.

Figure 6:
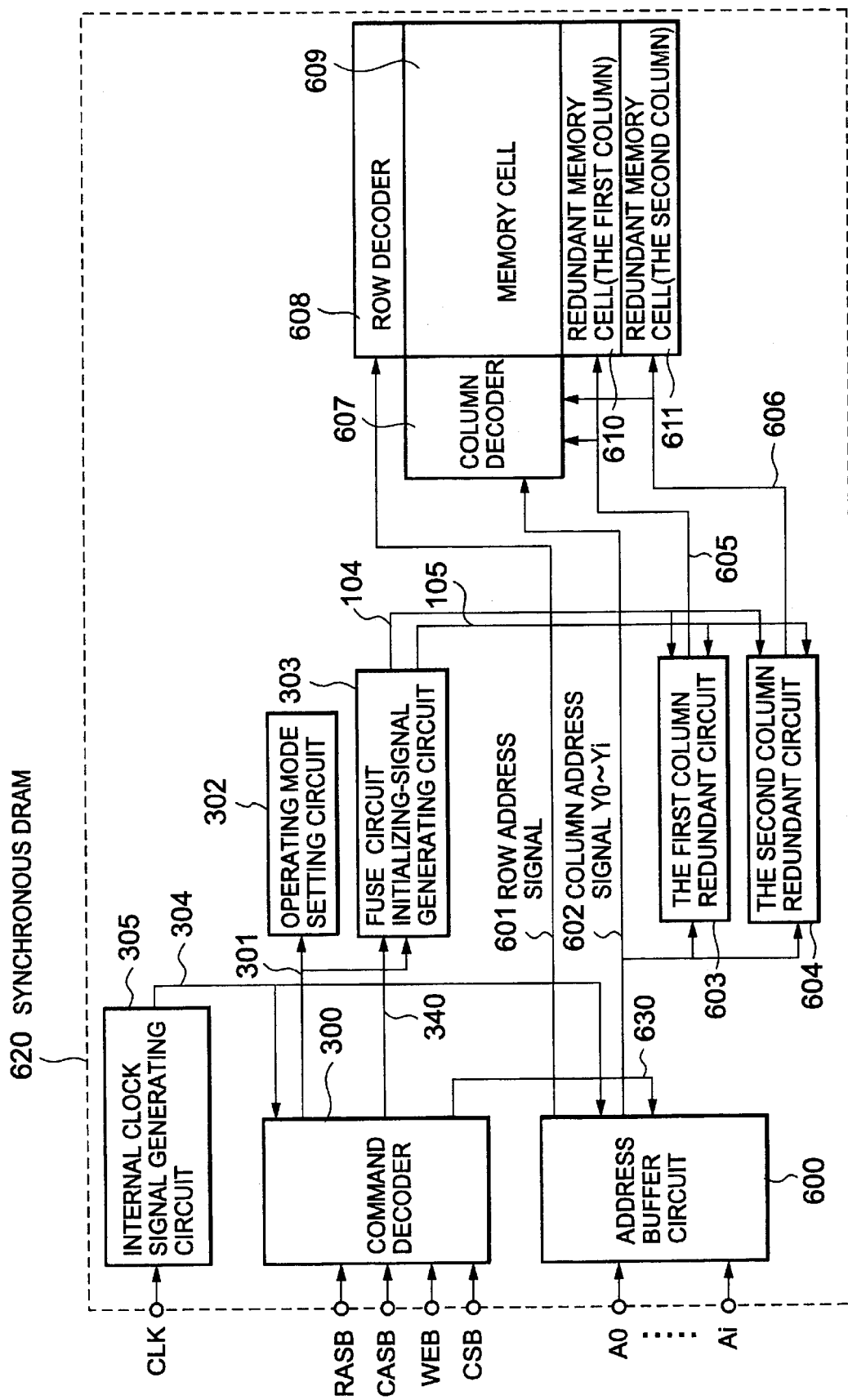
FIG. 6 illustrates the configuration of a synchronous DRAM, wherein the fuse circuit, according to the present invention, is used in the column redundant circuits.

FIG. 6 illustrates the entire configuration of a synchronous DRAM with column redundant circuits, each using the fuse circuit, according to the present invention.

The synchronous DRAM includes the command decoder, the fuse circuit initializing signal generating circuit, etc. as explained while referring to FIG. 3. The first initializing signal 104 and the second initializing signal 105 enter the first column redundant circuit 603 and the second column redundant circuit 604, respectively.

The column redundant circuits 603 and 604 determine whether column address signals (Y0 to Yi) 602, which are taken by the address buffer circuit 600, are equal to an address which should be replaced. If yes, the column redundant circuits 603 and 604 output respective replacing signals 605 and 606. These signals make invalid the column decoder's (607) selection of data stored in memory cells 609, but allow the selection of data stored in redundant memory cells 610 and 611.

Figure 7:
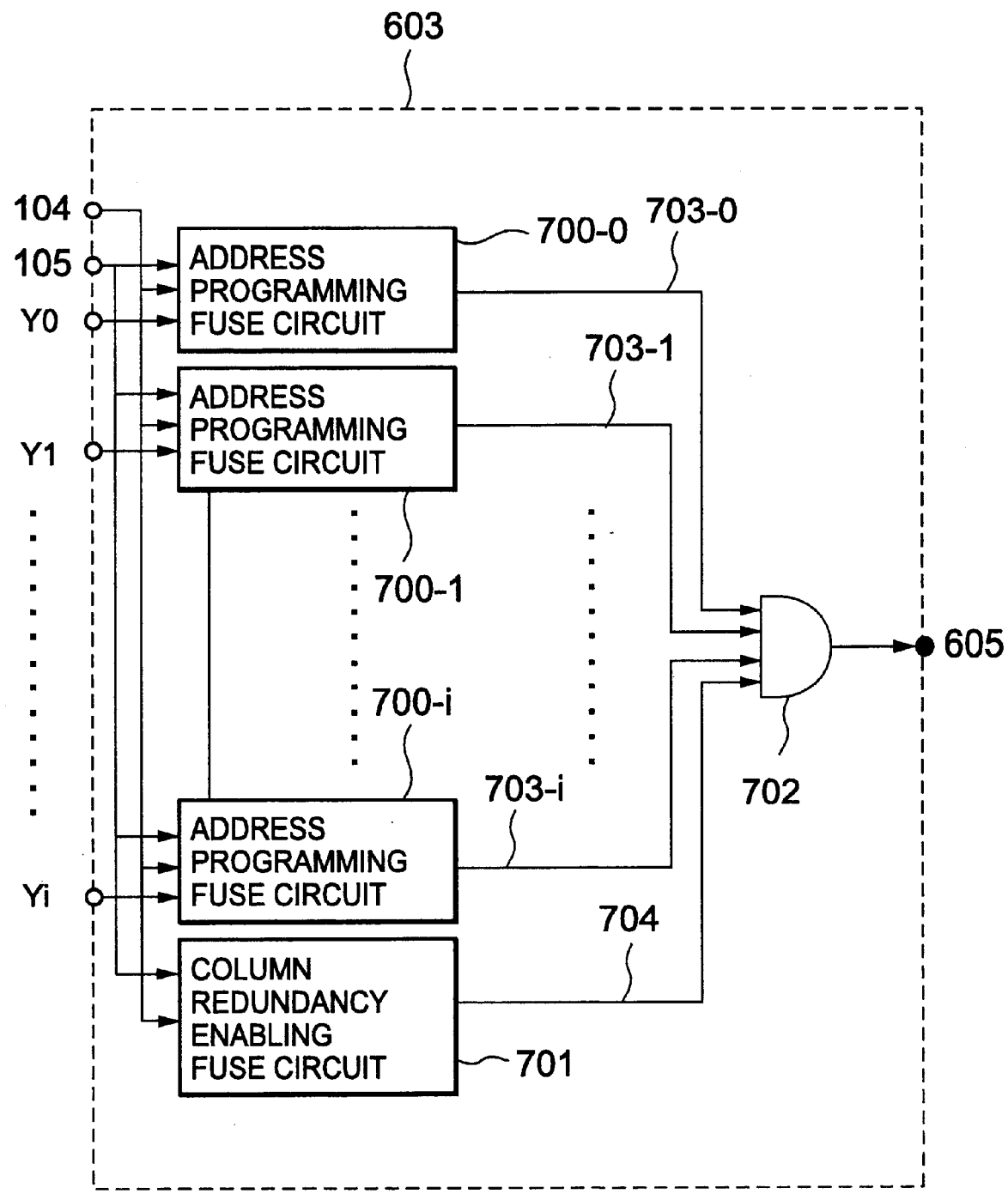
FIG. 7 illustrates the configuration of the first column redundant circuit in FIG. 6.

FIG. 7 illustrates the configuration of the first column redundant circuit 603. The address signals Y0 to Yi are taken by address programming fuse circuits 700-0 to 700-i.

A logical address value is programmed in the address programming fuse circuits 700-0 to 700-i by selectively cutting off fuses. If the input address signals are equal to the programmed address, the address programming fuse circuits 700-0 to 700-i all output high levels of output signals 703-0 to 703-i.

In order for the column redundancy enabling fuse circuit 701 to replace the memory cell at a specific address with a spare one, the fuse is cut off, thus outputting a high level of enabling signal 704. The output signals 703-0 to 703-i, and the high level of enabling signal 704 enters the AND gate 702. If input address signals are equal to the programmed address, which is set in the address programming fuse circuits 700-0 to 700i, and the column redundancy enabling signal 704 is high level, then a high level replacing signal 605 is output.

Figure 8:
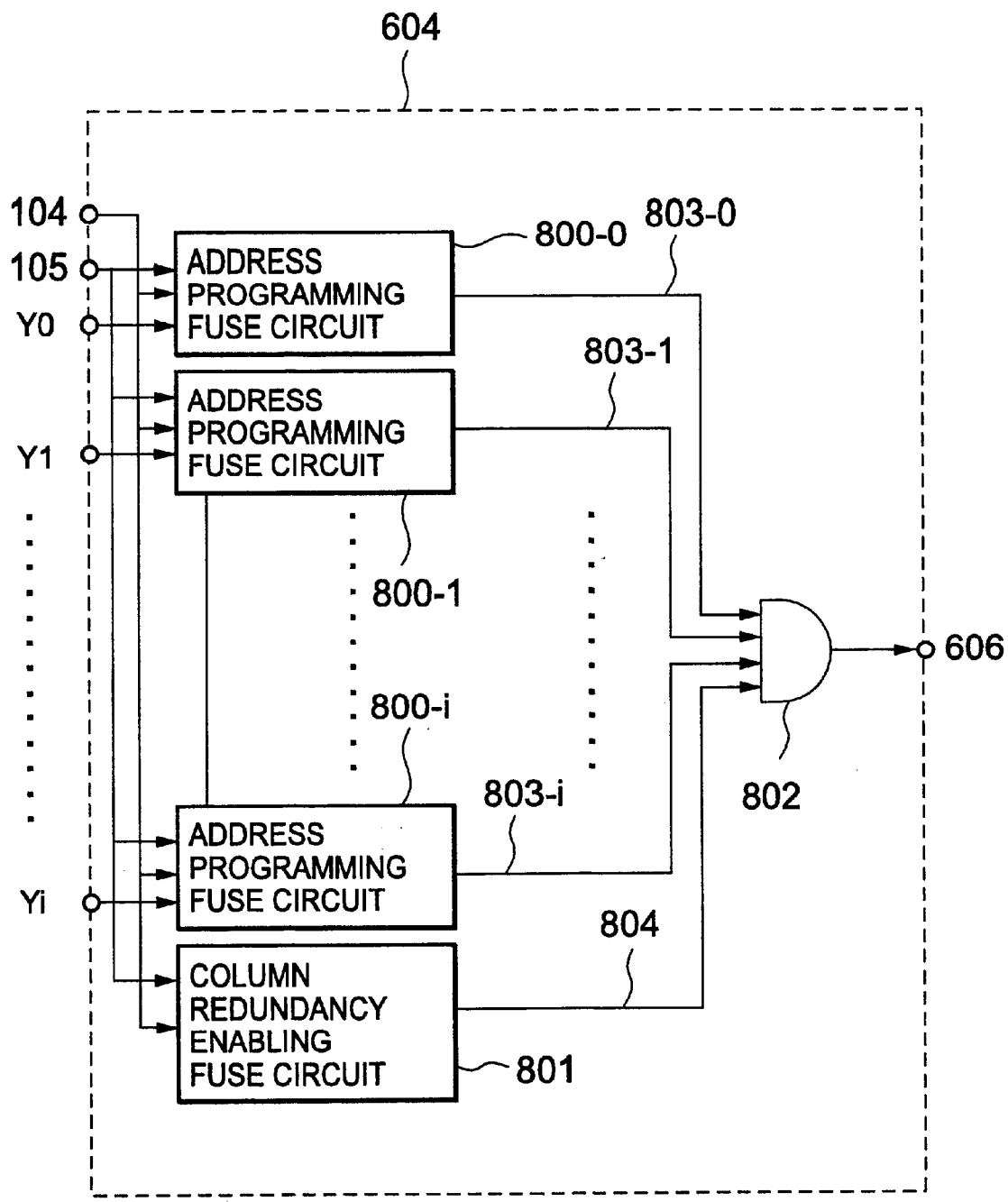
FIG. 8 illustrates the configuration of the second column redundant circuit in FIG. 6.

FIG. 8 illustrates the configuration of the second column redundant circuit 604, which acts as a circuit in the same way as the one in FIG. 7. Specifically, the address signals Y0 to Yi are taken by the address programming fuse circuits 800-0 to 800-i.

The address programming fuse circuits 800-0 to 800-i are programmed by selectively cutting off fuses. If the input address signals are equal to the programmed address, the address programming fuse circuits 800-0 to 800-i all output high levels of output signals 803-0 to 803-i.

In order for the column redundancy enabling fuse circuit 801 to replace the memory cell at a specific address with a spare one, the fuse is cut off, thus outputting a high level enabling signal 804. The output signals 803-0 to 803-i, and the high level of enabling signal 804 enters the AND gate 702. If input address signals are equal to the programmed address, which is set in the address programming fuse circuits 800-0 to 800i, and the column redundancy enabling signal 804 is high level, a high level of replacing signal 606 is output.

Figure 9:
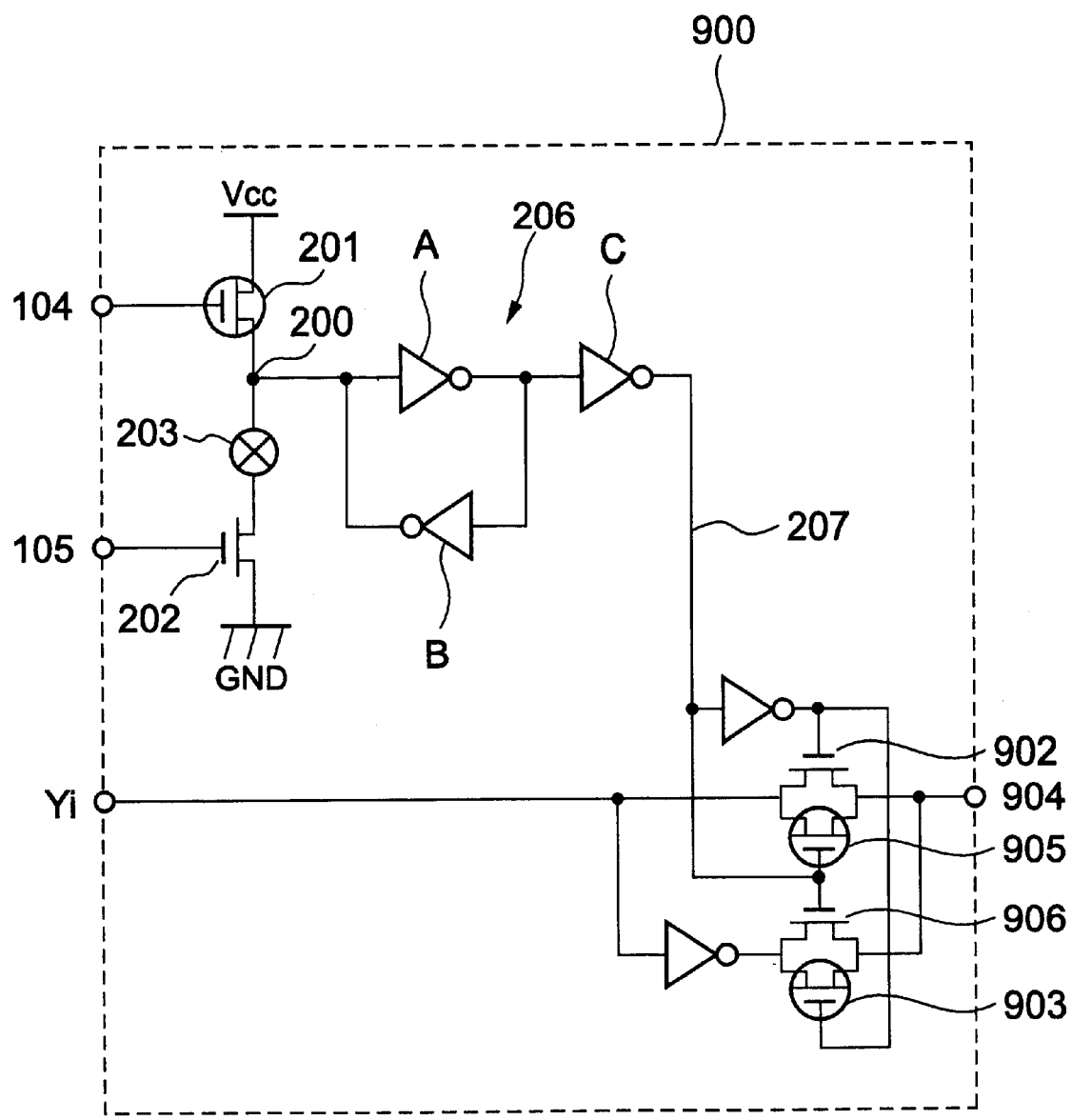
FIG. 9 illustrates the detailed configuration of the address programming fuse circuits in FIGS. 7 and 8.

FIG. 9 illustrates the detailed configuration of an address programming fuse circuit 900 (which is equal to each of the circuits 700-0 to 700-i in FIG. 7, and 800-0 to 800-i in FIG. 8). The address programming fuse circuit 900 uses a fuse circuit in the same way as the one in FIG. 2.

In the address programming fuse circuit 900, which is made up of a fuse circuit and transfer gates (902, 905, 903 and 906), the programmed value is fixed with the help of the initializing signals 104 and 105.

The output signal 207 of the fuse circuit enters the gate electrodes of the respective p-channel MOS transistor 905 and the n-channel MOS transistor 906, whereas the inverted output signal 207 enters the gate electrodes of the respective p-channel MOS transistor 903 and the n-channel MOS transistor 902.

With this configuration of the address programming fuse circuit 900, the output signal of the fuse circuit 207 is a low level, in the case where the fuse 203 is not cut off. This output signal 207 allows the n-channel transfer gate 902 to turn on, and the p-channel transfer gate 903 to turn off, thus outputting an output signal 904 with the same logical value as that of the input address signal Yi. Specifically, when the input address signal Yi is high level, the output signal 904 is also high level. Conversely, when the input address signal Yi is low level, the output signal 904 is also low level. It is noted that the output signal 904 corresponds to each of the output signals 703-0 to 703-i (in FIG. 7) and 803-0 to 803-i (in FIG. 8).

On the other hand, the output signal of the fuse circuit 207 is high level, in the case where the fuse 203 is cut off. This output signal 207 allows the n-channel transfer gate 902 to turn off, and the p-channel transfer gate 903 to turn on, thus outputting an output signal 904 with the opposite, logical value to that of input address signal Yi. Specifically, when the input address signal Yi is low level, the output signal 904 is high level. Conversely, when the input address signal Yi is high level, the output signal 904 is low level.

Figure 10:
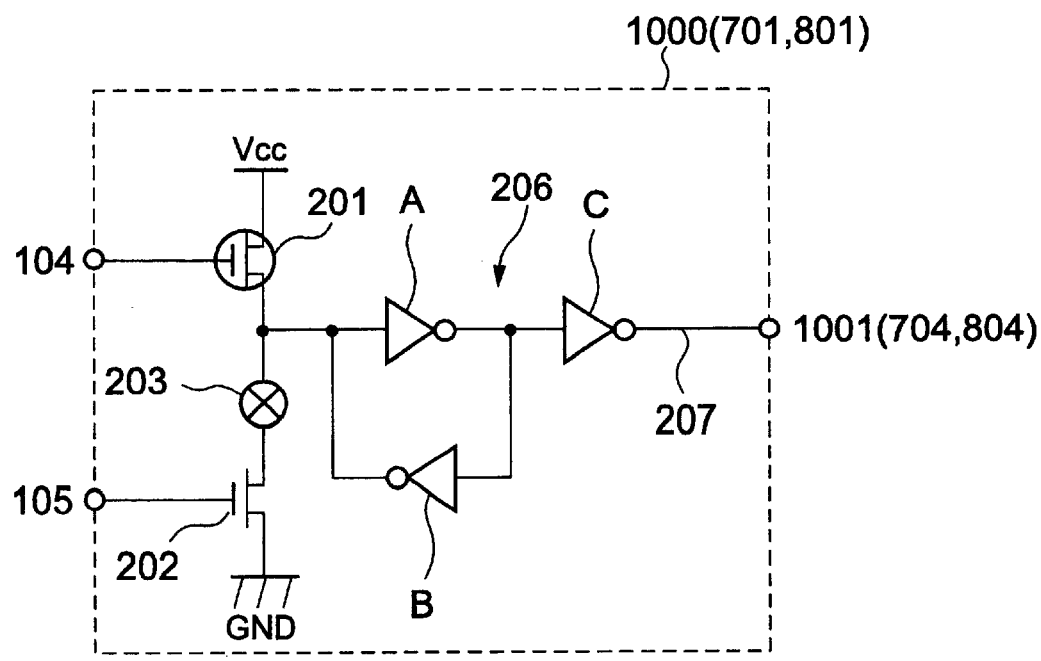
FIG. 10 illustrates the detailed configuration of the column redundancy enabling fuse circuits in FIGS. 7 and 8.

FIG. 10 illustrates the configuration of a column redundancy enabling fuse circuit 1000, which is an example of the detailed configuration of the column redundancy enabling fuse circuits 701 (in FIG. 7) and 801 (in FIG. 8). The column redundancy enabling fuse circuit 1000 in FIG. 10 uses the same type of fuse circuit as that shown in FIG. 2.

In the column redundancy enabling fuse circuit 1000 with a fuse circuit, the programmed value is fixed with the help of the initializing signals 104 and 105. In the case where the fuse is not cut off, the circuit 1000 outputs a low level signal (1001). Conversely, where the fuse is cut off, the circuit outputs a high level signal (1001), thus allowing the respective output signals 703-0 to 703-i (in FIG. 7) or the respective output signals 803-0 to 803-i (in FIG. 8) to become valid.

Figure 11:
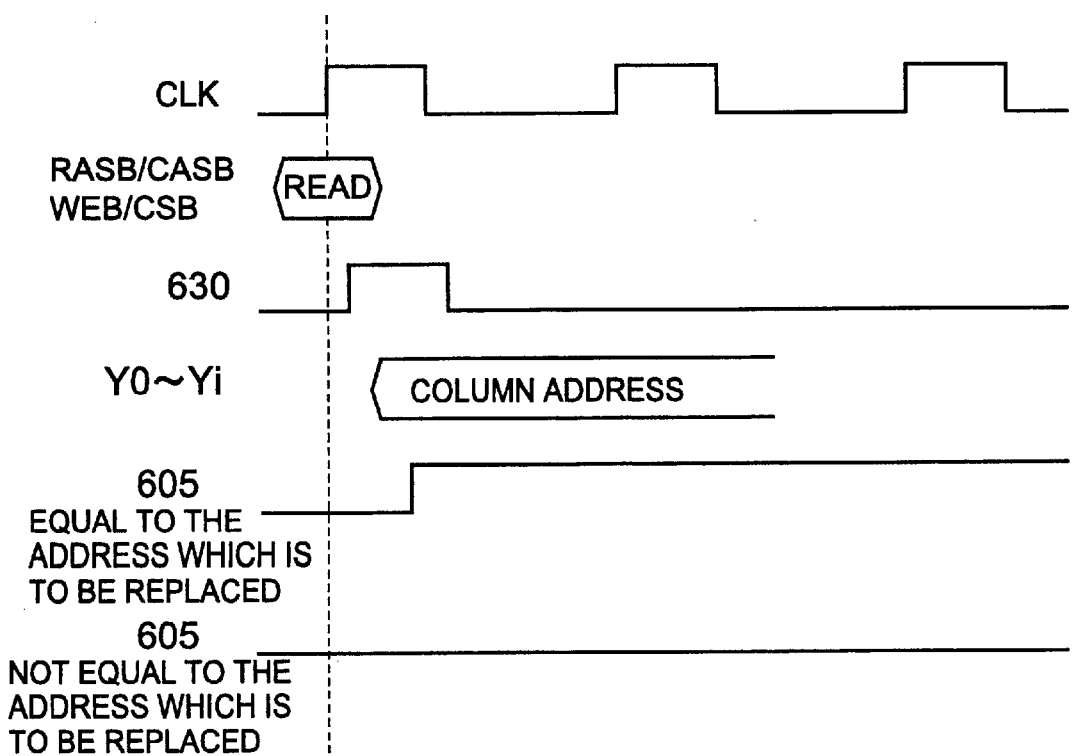
FIG. 11 is a timing-chart showing the operation of a redundant decoder.

FIG. 11 is a timing-chart showing the operation of the redundant decoder.

The signal 630 in FIG. 11 (i.e., the signal 630, as shown in FIG. 6, that the command decoder 300 outputs to the address buffer 600) is a read command signal. In FIG. 11, READ refers to the input of the read command signal. When the read command signal is input, the column address signals Y0 to Yi are taken in, and data stored in the corresponding memory cell is read out.

The read command signal 630 enters the address buffer circuit 600, which then generates the column address signals Y0 to Yi. The generated column address signals Y0 to Yi enter the first column redundant circuit 603, which then determines whether the column address signals Y0 to Yi are equal to the replacing addresses, which has been programmed.

If yes, and the first column redundant circuit 603 is enabled to output a replacing signal, then the high level replacing signal 605 is output. Otherwise, if not, the low level replacing signal is output.

Up to this point, the normal operation of the embodiment has been described.

Next, an example of the operation of determining whether or not a redundant memory cell is defective, before the fuses are programmed or selectively cut off, will be described.

Figure 12:
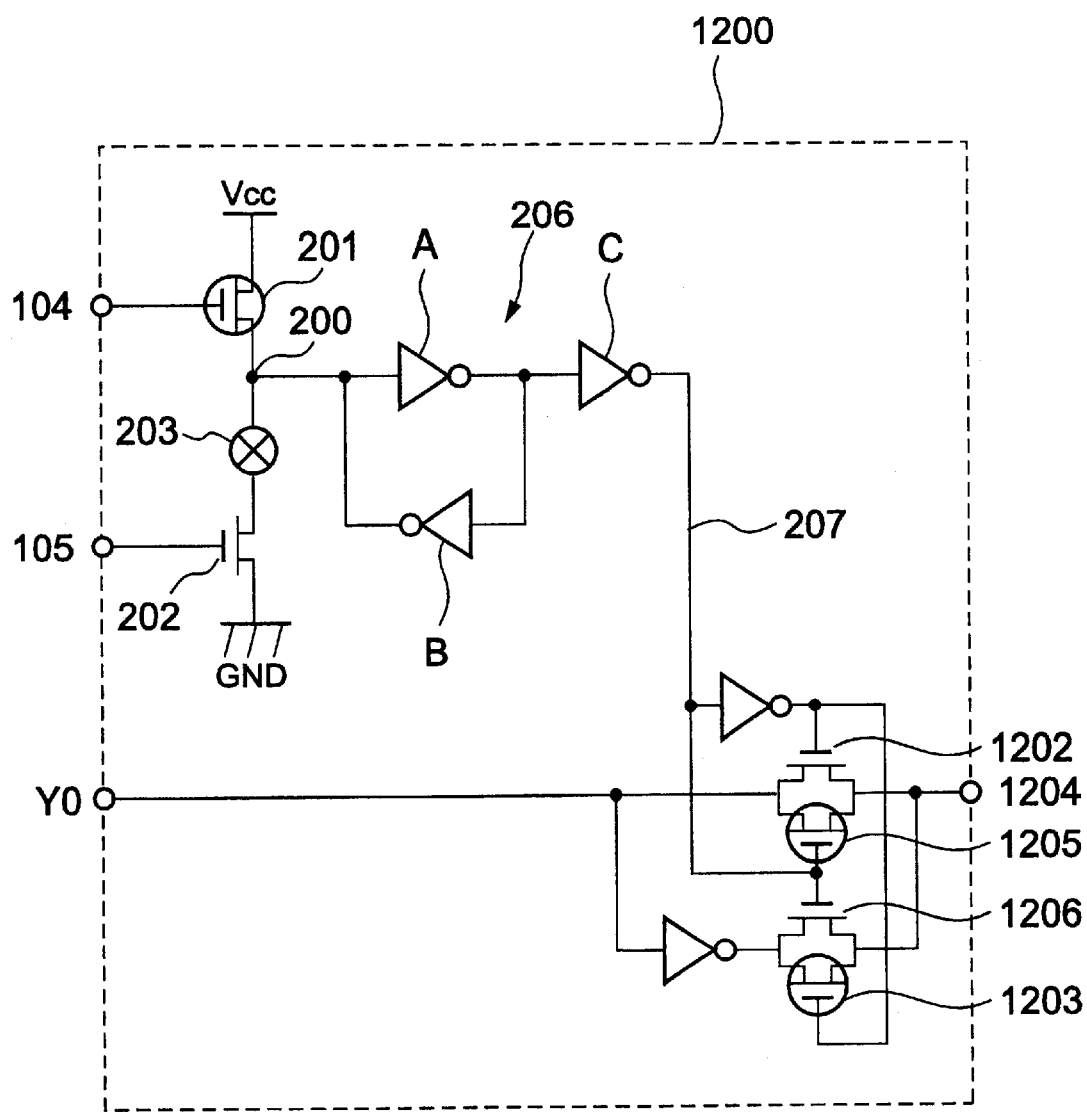
FIG. 12 illustrates the configuration of the address programming fuse circuit, according to the embodiment of the present invention, explaining a test which determines whether or not a defect exists in a redundant memory cell; wherein the address programming fuse circuit programs the column address, Y0, of the first column redundant circuit.
Figure 13:
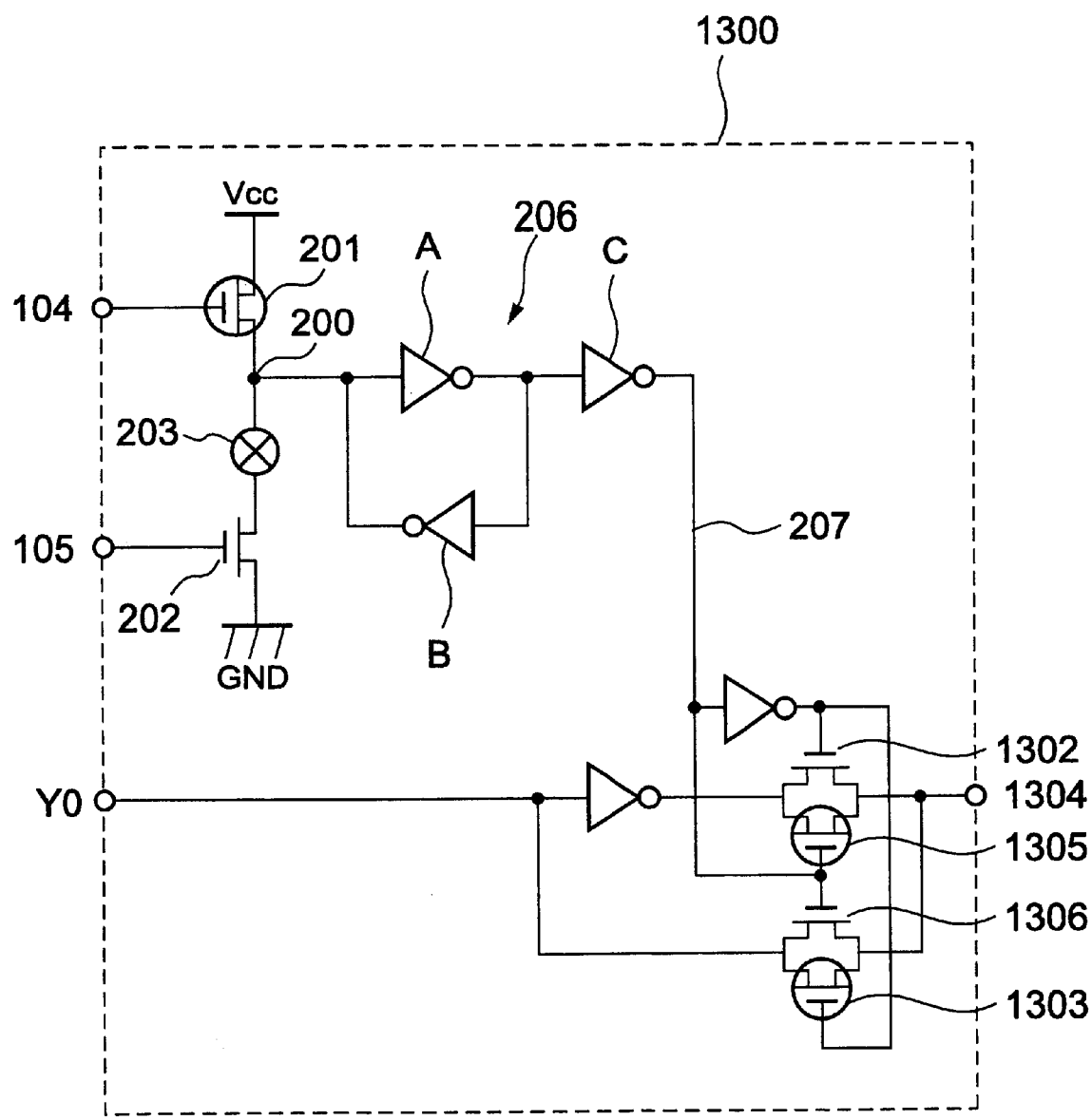
FIG. 13 illustrates the configuration of the address programming fuse circuit, according to the embodiment of the present invention, explaining a test which determines whether or not a defect exists in a redundant memory cell; wherein the address programming fuse circuit programs the column address, Y0, of the second column redundant circuit.

FIGS. 12 and 13 illustrate the detailed configurations (1200 and 1300) of the respective address programming fuse circuits (700-3 and 800-3).

The address programming fuse circuit 1200 programs a logical value corresponding to the column address Y0, which has entered the first column redundant circuit 603, as shown in FIGS. 6 and 7.

The output signal 207 of a fuse circuit, made up of a latch circuit 206 (A, B, and C), MOS transistors 201 and 202, and a fuse 203, enters the gates of the p-channel MOS transistor 1205 and the n-channel MOS transistor 1206. The opposite, logical signal to the output signal 207 enters the gates of the n-channel MOS transistor 1202 and the p-channel MOS transistor 1203.

According to the configuration of the address programming fuse circuit 1200 as described above, the output signal 207 of the fuse circuit is high level in the case where the fuse 203 is cut off. This allows the n-channel transfer gate 1202 to turn off, and the p-channel transfer gate 1203 to turn on. Therefore, an output signal 1204 with the opposite, logical value to the column address Y0, is output.

The address programming fuse circuit 1300 in FIG. 13 programs a logical value corresponding to the column address Y0, which has entered the second column redundant circuit 604, as shown in FIGS. 6 and 8.

The output signal 207 of the fuse circuit, made up of a latch circuit 206 (A, B, and C), MOS transistors 201 and 202, and a fuse 203, enters the gates of the p-channel MOS transistor 1305 and the n-channel MOS transistor 1306. The opposite, logical signal to the output signal 207 enters the gates of the n-channel MOS transistor 1302 and the p-channel MOS transistor 1303.

According to the configuration of the address programming fuse circuit 1300 as described above, the output signal 207 of the fuse circuit is high level, in the case where the fuse 203 is cut off. This allows the n-channel transfer gate 1302 to turn off, and the p-channel transfer gate 1303 to turn on. Therefore, an output signal 1304 with the opposite, logical value to the column address Y0, is output.

The configuration of each of the address programming fuse circuits, 700-1 to 700-i, and 800-1 to 800-i, is identical to that of the circuit in FIG. 9.

In the case where each of the fuses in the respective address programming fuse circuits, are cut off, the logical address values corresponding to the column addresses Y1 to Yi are accordingly all programmed to be the logical zero. Specifically, in the case where the fuses in the first and the second column redundant circuit are all cut off, the first column redundant circuit 603 programs all of the logical address values corresponding to the column addresses Y1 to Yi, to be logically zero, whereas the second column redundant circuit 604 programs all of the logical address values corresponding to the column addresses Y1 to Yi, to be logically one.

Whether or not there is a defective, redundant cell is determined by entering a test mode. The entry to the test mode is done by setting the aforementioned mode setting register to a certain address value.

Figure 14:
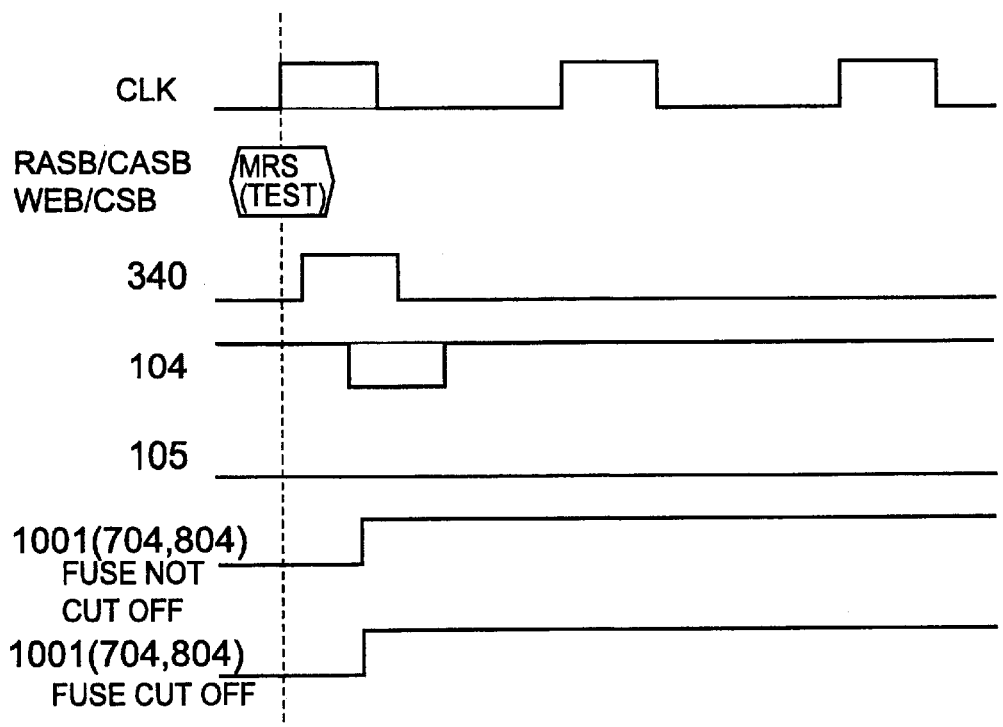
FIG. 14 is a timing-chart showing the operation in a test mode wherein whether or not a defect exists in the redundant memory cell is determined.

FIG. 14 is a timing-chart showing the operation of the synchronous DRAM in FIG. 6 in the test mode. MRS (TEST) in FIG. 14 denotes a command for setting the mode register. It is noted that the description of the entry of a certain address value is omitted in FIG. 14.

In FIG. 4, upon the entry to the test mode, where the test of each redundant memory cell can be done, only the first initializing signal 104 becomes active, whereas, unlike the case of performing the ordinary initializing process, the second initializing signal 105 is inactive.

Thus, all of the contacts 200 in the respective fuse circuits in FIGS. 2, 9, 12, and 13, are fixed to be the first voltage level, whether the fuses are cut off or not. In other words, the fuses are all initialized to enter a cut-off state.

Figure 15:
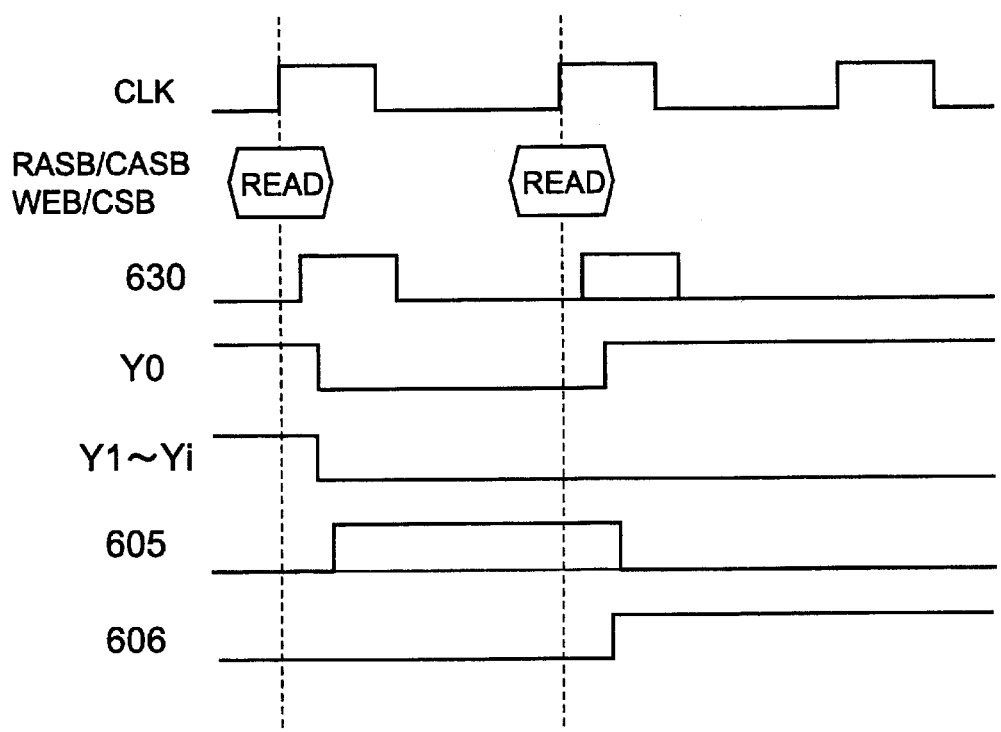
FIG. 15 is timing chart showing the operation of generating a replacing signal in response to a read command.

As described above, the first column redundant circuit 603 programs all of the logical address values corresponding to the column addresses Y1 to Yi, to be logically zero, whereas the second column redundant circuit 604 programs all of the logical address values corresponding to the column addresses Y1 to Yi, to be logically one, in the case where the fuses in the first and the second column redundant circuit are all cut off. Therefore, when the synchronous DRAM 620 receives the column address made up of all "0s" and a read command at the same time, a test of reading out data stored in the redundant memory cell 610 (see FIG. 6) can be done. In the same manner, when the synchronous DRAM 620 receives the column address made up of all "1s" and a read command at the same time, a test of reading out data stored in the redundant memory cell 611 (see FIG. 6) can be done. FIG. 15 is a timing-chart showing the above test for the redundant memory cells 610 and 611. First, the first read command along with the column address made up of all "0s" enters the first column redundant circuit 603. Since the column address entered is equal to the logical address value programmed in the first column redundant circuit 603, the high level replacing signal 605 is output. This allows access to the redundant memory cell 610.

Secondly, the second read command along with the column address made up of all "1s" enters the first column redundant circuit 604. Since the column address entered is equal to the logical address value programmed in the second column redundant circuit 604, a high level replacing signal 606 is output. This allows access to the redundant memory cell 611.

The embodiment, according to the present invention, is featured with the logical configuration comprising a plurality of column redundant circuits, each programming a separate, logical address value by selectively cutting off the fuses, and each being initialized, in the test mode, into a state which is equivalent to the state where the fuses are all cut off.

Figure 16:
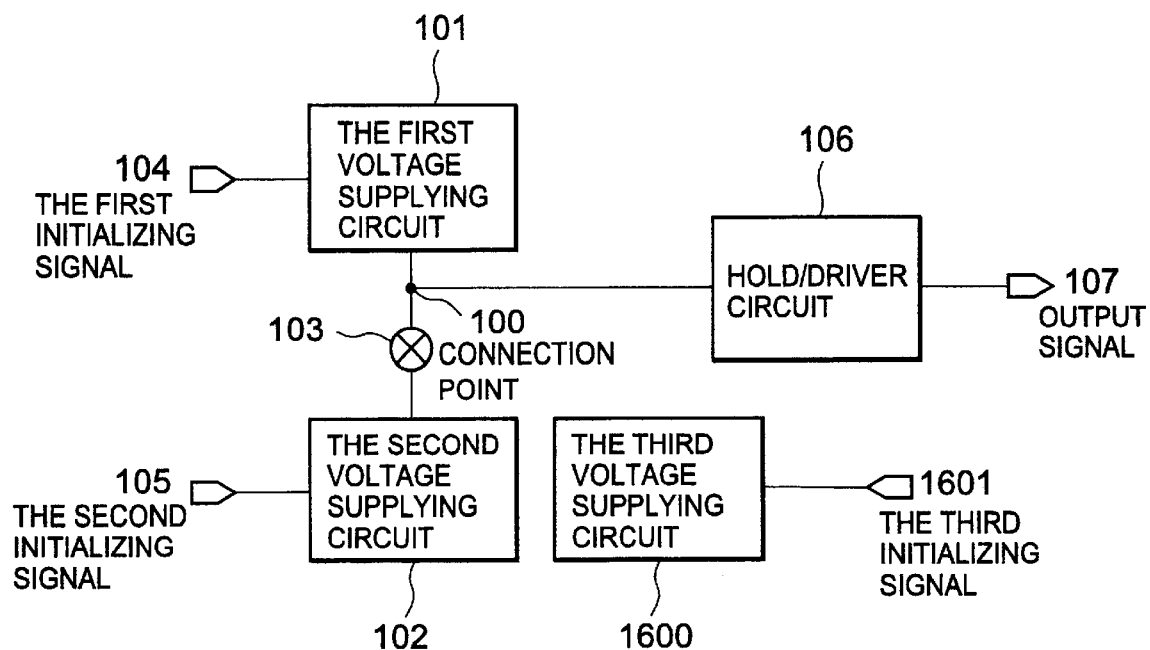
FIG. 16 illustrates the configuration of a fuse circuit, which can set up the level of a programmable contact to a desired one.

FIG. 16 illustrates a means, according to the present invention, which fixes the level of a contact 100 at a desired level in the test mode, whether or not the fuse 103 is cut off. In the embodiment, the third voltage supplying circuit 1600 is added to a fuse circuit, made up of the first voltage supplying circuit 101 and the second voltage supplying circuit 102. With this configuration, the third initializing signal 1601 enters the third voltage supplying circuit in only the test mode, thus controlling the level of the contact 100 at a desired level. Accordingly, the means can be initialized into even the state where the fuse is not cut off.

Figure 17:
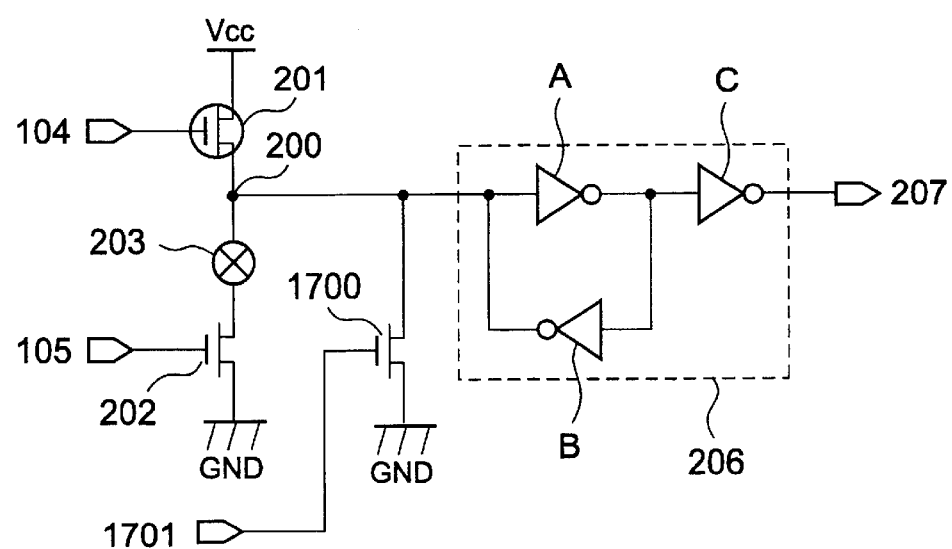
FIG. 17 illustrates the detailed configuration of the fuse circuit in FIG. 16.

FIG. 17 illustrates an example of the detailed configuration, made up of a plurality of MOS transistors, of the means in FIG. 16.

In FIG. 17, when the high level, third initializing signal 1701 enters an n-channel MOS transistor 1700, the transistor 1700 turns on, fixing a contact 200 to be low level (the grounding level). The low level is equivalent to the one in the case where the fuse 203 is not cut off. The combination of the above means and the aforementioned embodiment, enables an expansion of the testing capacity for a variety of combinations of cut-off fuses and not-cut-off fuses.

(Results of the Present Invention)

In the fuse circuit, according to the present invention, a binary voltage is supplied for the aforementioned contact, the voltage level (programmed value) at which is latched by a subsequent latch circuit, thus fixing the voltage level of the contact within only the device initializing time. Therefore, an unnecessary current path is not generated within the ordinary operation. This prevents the occurrence of an unnecessary, electric current flow, possibly caused by an incompletely cut-off fuse, which is cut off by a laser. In addition, there is a benefit in that no increase in current flow in a stand-by-mode is made. Moreover, a device including the fuse circuit, according to the present invention, can be normally and surely initialized during the device initializing time.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A fuse circuit comprising:

a fuse element having first and second nodes;

first and second power nodes;

a first control circuit, which receives a first initializing signal generated during a time period for setting a device operating mode, connected between said first power node and said first node of said fuse element;

a second control circuit, which receives a second initializing signal generated during said time period for setting a device operating mode, connected between said second power node and said second node of said fuse element; and a latch circuit having an input node connected to said second node of said fuse element to store information thereon.

2. The fuse circuit as in claim 1, further comprising a third control circuit, connected between a third power node and said first node of said fuse element, controlling said first and said second control circuits in response to a command.

3. The fuse circuit as in claim 2, wherein said command is a plurality of timing signals.

4. The fuse circuit as in claim 3, wherein said plurality of timing signals include at least RAS and CAS.

5. The fuse circuit as in claim 2, wherein said first control circuit is a first transistor of a first conductivity type and said second control circuit is a second transistor of a second conductivity type different from said first conductivity type.

6. The fuse circuit as in claim 2, wherein said third control circuit activates said first control circuit and said second control circuit in this order in response to said command.

7. A redundant decoder circuit receiving an address for detecting a programmed address comprising:
   a plurality of address programming circuits corresponding to bits constituting said address, said address programming circuits comprising:
      a fuse element having first and second nodes;
      a first control circuit which receives a first initializing signal generated during a time period for setting a device operating mode, connected between said first power node and said first node of said fuse element;
      a second control circuit which receives a second initializing signal generated during said time period for setting a device operating mode, connected between said second power node and said second node of said fuse element;
      a latch circuit having an input node connected to said second node of said fuse element to store information thereon;
      a select circuit selecting between an inverted level or non-inverted level output of said corresponding bit of said address based on said information stored in said latch circuit; and
   a gate circuit receiving one of said output of said select circuit of each of said plurality of address programming circuits to detect said programmed address.

8. A first circuit comprising:
   a first voltage supplying circuit, which receives a first initializing signal generated during a time period for setting a device operating mode;
   a second voltage supplying circuit, which receives a second initializing signal generated during a time period for setting a device operating mode;
   a fuse connected between said first voltage supplying circuit and said second voltage supplying circuit; and
   a hold/driver circuit connected to a contact of said first voltage supplying circuit and said fuse;
   wherein said first voltage supplying circuit provides a first voltage for said contact in conformity with said first initializing signals, said second voltage supplying circuit provides a second voltage for said contact in conformity with said second initializing signal and said hold/driver circuit holds either said first voltage or said second voltage and outputs said first or said second voltage.

9. A fuse circuit as in claim 8, further comprising a third voltage supplying circuit, connected between a third voltage supplying circuit and said fuse, controlling said first and said second voltage supplying circuits in response to a command.

10. The fuse circuit as in claim 8 wherein said fuse is cut off or not cut off, a voltage at said contact is fixed or programmed as said first voltage when said fuse is not cut off or as said second voltage when said fuse is cut off.

11. The fuse circuit as in claim 8, wherein said first and said second voltage supplying circuits are a plurality of MOS transistors, said hold/driver circuit is several inverters, a composite of a pair of said several inverters is a flip-flop circuit, and said flip-flop circuit holds said first or said second voltage fixed at said contact.

* * * * *